US009879338B2

(12) United States Patent
Ito et al.

(10) Patent No.: US 9,879,338 B2
(45) Date of Patent: Jan. 30, 2018

(54) METHOD OF MANUFACTURING ELECTRICALLY CONDUCTIVE MAYENITE COMPOUND WITH HIGH ELECTRON DENSITY

(71) Applicant: Asahi Glass Company, Limited, Tokyo (JP)

(72) Inventors: Kazuhiro Ito, Tokyo (JP); Satoru Watanabe, Tokyo (JP); Toshinari Watanabe, Tokyo (JP); Naomichi Miyakawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 286 days.

(21) Appl. No.: 14/659,866

(22) Filed: Mar. 17, 2015

(65) Prior Publication Data

US 2015/0184282 A1 Jul. 2, 2015

Related U.S. Application Data

(63) Continuation of application No. PCT/JP2013/075928, filed on Sep. 25, 2013.

(30) Foreign Application Priority Data

Sep. 28, 2012 (JP) ................................. 2012-217342

(51) Int. Cl.
*C04B 35/44* (2006.01)
*C23C 14/34* (2006.01)
(Continued)

(52) U.S. Cl.
CPC .......... *C23C 14/3414* (2013.01); *C01F 7/002* (2013.01); *C01F 7/164* (2013.01);
(Continued)

(58) Field of Classification Search
CPC ..................... C04B 35/44; C04B 2235/6587
See application file for complete search history.

(56) References Cited

U.S. PATENT DOCUMENTS 8,304,974 B2 11/2012 Watanabe et al.
8,377,413 B2 2/2013 Ito et al.
(Continued)

FOREIGN PATENT DOCUMENTS

CN 103547547 A 1/2014
CN 104395239 A 3/2015
(Continued)

OTHER PUBLICATIONS

International Search Report issued in International Application No. PCT/JP2013/075928, dated Oct. 22, 2013.
F.M. Lea, et al; The Chemistry of Cement and Concrete, $2^{nd}$ ed., p. 52; Edward Arnold & Co., London; 1956.
Combined Chinese Office Action and Search Report dated Jul. 1, 2016 in Patent Application No. 201380050813.5 (with English Translation of Categories of Cited Documents).
(Continued)

*Primary Examiner* — Erin Snelting
(74) *Attorney, Agent, or Firm* — Oblon, McClelland, Maier & Neustadt, L.L.P.

(57) ABSTRACT

A method of manufacturing an electrically conductive mayenite compound, includes preparing a body to be processed including a mayenite compound; and placing the body to be processed in the presence of carbon monoxide gas and aluminum vapor supplied from an aluminum source without being in contact with the aluminum source and retaining the body to be processed at a temperature range of 1080° C. to 1450° C. under a reducing atmosphere.

10 Claims, 3 Drawing Sheets

(51) Int. Cl.
*C01F 7/00* (2006.01)
*C01F 7/16* (2006.01)
*C04B 35/117* (2006.01)
*C04B 35/64* (2006.01)
*H01B 1/08* (2006.01)

(52) U.S. Cl.
CPC ........ *C04B 35/117* (2013.01); *C01P 2006/40* (2013.01); *C04B 35/44* (2013.01); *C04B 35/64* (2013.01); *C04B 2235/3208* (2013.01); *C04B 2235/3213* (2013.01); *C04B 2235/3224* (2013.01); *C04B 2235/3225* (2013.01); *C04B 2235/3227* (2013.01); *C04B 2235/3229* (2013.01); *C04B 2235/3232* (2013.01); *C04B 2235/3241* (2013.01); *C04B 2235/3262* (2013.01); *C04B 2235/3272* (2013.01); *C04B 2235/3275* (2013.01); *C04B 2235/3279* (2013.01); *C04B 2235/3286* (2013.01); *C04B 2235/3287* (2013.01); *C04B 2235/3409* (2013.01); *C04B 2235/3418* (2013.01); *C04B 2235/402* (2013.01); *C04B 2235/445* (2013.01); *C04B 2235/46* (2013.01); *C04B 2235/652* (2013.01); *C04B 2235/658* (2013.01); *C04B 2235/6581* (2013.01); *C04B 2235/6587* (2013.01); *C04B 2235/664* (2013.01); *C04B 2235/77* (2013.01); *H01B 1/08* (2013.01)

(56) References Cited

U.S. PATENT DOCUMENTS

| | | |
|---|---|---|
| 8,454,930 B2 | 6/2013 | Ito et al. |
| 2006/0151311 A1 | 7/2006 | Hosono et al. |
| 2008/0089826 A1 | 4/2008 | Hosono et al. |
| 2011/0182803 A1 | 7/2011 | Ito et al. |
| 2014/0061551 A1 | 3/2014 | Ito et al. |
| 2015/0136593 A1 | 5/2015 | Ito et al. |

FOREIGN PATENT DOCUMENTS

| | | |
|---|---|---|
| EP | 1 717 217 A1 | 11/2006 |
| EP | 1 897 853 A1 | 3/2008 |
| EP | 2 708 521 A1 | 3/2014 |
| JP | 2010-132467 | 6/2010 |
| JP | 2012-25636 | 2/2012 |
| JP | 2012-126618 | 7/2012 |
| WO | WO 2005/000741 A1 | 1/2005 |
| WO | WO 2006/129674 A1 | 12/2006 |
| WO | WO 2010/041558 A1 | 4/2010 |
| WO | WO 2010/074092 A1 | 7/2010 |
| WO | WO 2012/157461 A1 | 11/2012 |
| WO | WO 2013/094346 A1 | 6/2013 |

OTHER PUBLICATIONS

U.S. Appl. No. 14/659,851, filed Mar. 17, 2015, Ito, et al.

METHOD OF MANUFACTURING ELECTRICALLY CONDUCTIVE MAYENITE COMPOUND WITH HIGH ELECTRON DENSITY

CROSS-REFERENCE TO RELATED APPLICATION

This application is a continuation application filed under 35 U.S.C. 111(a) claiming the benefit under 35 U.S.C. 120 and 365(c) of PCT International Application No. PCT/JP2013/075928 filed on Sep. 25, 2013, which is based upon and claims the benefit of priority of Japanese Priority Application No. 2012-217342 filed on Sep. 28, 2012, the entire contents of which are hereby incorporated by reference.

BACKGROUND OF THE INVENTION

1. Field of the Invention

The present invention relates to a method of manufacturing an electrically conductive mayenite compound with a high electron density.

2. Description of the Related Art

A mayenite compound has a typical composition expressed as $12CaO \cdot 7Al_2O_3$, and has a characteristic crystalline structure including three-dimensionally connected cages, each having a diameter about 0.4 nm. A skeletal structure structuring the cages is positively charged, and forms twelve cages per unit lattice. Oxygen ions occupy 1/6 of the cages in order to satisfy an electrical neutrality condition of the crystal. However, the oxygen ions inside the cages have a chemical characteristic different from the oxygen ions composing the skeletal structure. Thus, the oxygen ions inside the cages are specifically referred to as "free oxygen ions". The mayenite compound is also expressed as $[Ca_{24}Al_{28}O_{64}]^{4+} \cdot 2O^{2-}$ (Non-Patent Document 1).

When a part of or all of the free oxygen ions inside the cages of the mayenite compound are substituted for by electrons, the mayenite compound is provided with an electrical conductivity. This is because, the electrons included in the cages of the mayenite compound can freely move in the crystal without being tied by the respective cages (Patent Document 1). Such a mayenite compound with the electrical conductivity is referred to, in particular, as an "electrically conductive mayenite compound".

Such an electrically conductive mayenite compound may be manufactured by, for example, a method of manufacturing by putting a mayenite compound powder in a carbon container with a cover and performing a heat treatment at 1300° C. under a nitrogen gas atmosphere (Patent Document 2). Hereinafter, this method is referred to as a "conventional method 1".

Further, such an electrically conductive mayenite compound may be manufactured by a method of manufacturing by putting a mayenite compound in an alumina container with a cover with aluminum and performing a heat treatment at 1300° C. in vacuum (Patent Document 2). Hereinafter, this method is referred to as a "conventional method 2".

PATENT DOCUMENTS

[Patent Document 1] WO 2005/000741
[Patent Document 2] WO 2006/129674

NON-PATENT DOCUMENT

[Non-Patent Document 1] F. M. Lea, C. H. Desch, The Chemistry of Cement and Concrete, 2nd ed., p.52, Edward Arnold & Co., London, 1956

However, according to the above described conventional method 1, there is a problem in that it is difficult to obtain an electrically conductive mayenite compound with a sufficiently high electron density. The electron density of the electrically conductive mayenite compound obtained by the conventional method 1 is less than $3 \times 10^{20}$ $cm^{-3}$.

The present inventors have found that, when an electrically conductive mayenite compound is used for a target for depositing a thin film in a vapor deposition method, for example, the electron density of a thin film that is formed by the target has a correlation with the electron density of the electrically conductive mayenite compound of the target. Thus, it is necessary to make the electron density of the electrically conductive mayenite compound used in the target be higher in order to increase the electron density of the thin film.

On the other hand, according to the above described conventional method 2, an electrically conductive mayenite compound with a high electron density more than $1 \times 10^{21}$ $cm^{-3}$ can be obtained. However, by this method, it is necessary to heat a body to be processed while being in contact with metal aluminum. The present inventors have found the following problem for this case.

As the melting point of metal aluminum is 660° C., if the body to be processed and metal aluminum are heated at a temperature higher than or equal to the melting point, liquid aluminum is formed at a surface of the object to be processed. When the temperature of the body to be processed is lowered to room temperature under this state, a body of metal aluminum that is generated by solidification of liquid is adhered to the surface of the formed electrically conductive mayenite compound. Such an adhered body strongly bonds to the electrically conductive mayenite compound and it is not easy to peel or remove the adhered body. In order to collect the electrically conductive mayenite compound, it is necessary to break a container or the like that is used in the heat treatment with a hammer, and carefully remove aluminum that is adhered around the electrically conductive mayenite compound using a power saw, a ceramics Leutor and sand paper. In particular, when assuming that the electrically conductive mayenite compound is used as a relatively large product such as a target for depositing a thin film in a vapor deposition, for example, it is extremely unrealistic to easily collect the electrically conductive mayenite compound from the container or the like that is used in the heat treatment. Thus, if such a phenomenon occurs, an additional process step is required when collecting the electrically conductive mayenite compound, which lacks productivity.

SUMMARY OF THE INVENTION

The present invention is made in light of the above problems, and provides a method of effectively manufacturing an electrically conductive mayenite compound with a high electron density.

According to a first aspect, there is provided a method of manufacturing an electrically conductive mayenite compound, including preparing a body to be processed including a mayenite compound; and placing the body to be processed in the presence of carbon monoxide gas and aluminum vapor supplied from an aluminum source without being in contact with the aluminum source and retaining the body to be processed at a temperature range of 1080° C. to 1450° C. under a reducing atmosphere.

Further, according to a second aspect, there is provided a method of manufacturing an electrically conductive mayenite compound, including (1) preparing a body to be processed including a mayenite compound, the body to be processed including a fluorine (F) component; and (2) placing the body to be processed in the presence of carbon monoxide gas and aluminum vapor supplied from an aluminum source without being in contact with the aluminum source and retaining the body to be processed at a temperature range of 1080° C. to 1450° C. under a reducing atmosphere.

According to the embodiment, it is possible to provide a method of effectively manufacturing an electrically conductive mayenite compound with a high electron density.

DETAILED DESCRIPTION OF THE PREFERRED EMBODIMENTS

In the embodiment, there is provided a method of manufacturing an electrically conductive mayenite compound, including
(1) a step of preparing a body to be processed including a mayenite compound,
(2) a step of placing the body to be processed in the presence of carbon monoxide gas and aluminum vapor supplied from an aluminum source without being in contact with the aluminum source and retaining the body to be processed at a temperature range of 1080° C. to 1450° C. under a reducing atmosphere.

Here, in this embodiment, the "mayenite compound" is a generic name of 12CaO. 7Al$_2$O$_3$ (hereinafter, referred to as "C12A7") that has a cage structure and a compound (an isomorphous compound) having a similar crystalline structure as C12A7. As the isomorphous compound of C12A7, 12SrO. 7Al$_2$O$_3$ is known.

Further, in this embodiment, an "electrically conductive mayenite compound" means a mayenite compound in which a part of or all of the "free oxygen ions" included in the cages are substituted for by electrons and having an electron density of greater than or equal to $1.0 \times 10^{18}$ cm$^{-3}$. Further, in particular, the mayenite compound whose electron density is greater than or equal to $3.0 \times 10^{20}$ cm$^{-3}$ is referred to as an "electrically conductive mayenite compound with a high electron density". The electron density is $2.3 \times 10^{21}$ cm$^{-3}$ when all of the free oxygen ions are substituted for by electrons.

Thus, the "mayenite compound" includes the "electrically conductive mayenite compound" and a "non-electrically conductive mayenite compound".

According to the embodiment, the electron density of the manufactured "electrically conductive mayenite compound" is, preferably, greater than or equal to $3.0 \times 10^{20}$ cm$^{-3}$ and the "electrically conductive mayenite compound with a high electron density" having a significantly higher electron density compared with the conventional method 1 using a carbon container with a cover can be obtained. The electron density of the electrically conductive mayenite compound manufactured in the embodiment is preferably greater than or equal to $5.0 \times 10^{20}$ cm$^{-3}$, more preferably, greater than or equal to $7.0 \times 10^{20}$ cm$^{-3}$, and furthermore preferably, greater than or equal to $1.0 \times 10^{21}$ cm$^{-3}$.

Here, generally, the electron density of the electrically conductive mayenite compound is measured by one of two methods based on the electron density of the mayenite compound. When the electron density is $1.0 \times 10^{18}$ cm$^{-3}$ to less than $3.0 \times 10^{20}$ cm$^{-3}$, diffuse reflection of the electrically conductive mayenite compound powder is measured, the diffuse reflection is performed with Kubelka-Munk transformation to obtain absorption spectra, and the electron density is calculated from the absorbance (Kubelka-Munk transformation value) at 2.8 eV (wavelength 443 nm) of the obtained absorption spectra. This method is based on the fact that the electron density and the Kubelka-Munk transformation value have a linear relationship. Hereinafter, a method of creating a calibration curve is explained.

First, four samples having different electron densities are prepared and electron densities of the four samples are obtained from signal strengths of electron spin resonance (ESR). The electron density capable of being measured by ESR is about $1.0 \times 10^{14}$ cm$^{-3}$ to $1.0 \times 10^{19}$ cm$^{-3}$. Logarithms of the Kubelka-Munk values and electron densities obtained by ESR are plotted to obtain a linear relationship and the obtained linear line was used as the calibration curve. It means that in this method, when the electron density is $1.0 \times 10^{19}$ cm$^{-3}$ to $3.0 \times 10^{20}$ cm$^{-3}$, the calibration curve is obtained by extrapolation.

When the electron density is $3.0 \times 10^{20}$ cm$^{-3}$ to $2.3 \times 10^{21}$ cm$^{-3}$, diffuse reflection of the electrically conductive mayenite compound powder is measured, the diffuse reflection is processed with Kubelka-Munk transformation to obtain absorption spectra, and the electron density is obtained by a conversion using a wavelength (energy) of a peak of the absorption spectra. The following relationship was used.

$$n = (-(E_{SP} - 2.83)/0.199)^{0.782} \quad (1)$$

Here, "n" indicates the electron density (cm$^{-3}$), and "$E_{SP}$" indicates energy (eV) of the peak of the absorption spectra obtained by Kubelka-Munk transformation.

In the application, for the electrically conductive mayenite compound, a part of at least one kind of atom selected from calcium (Ca), aluminum (Al) and oxygen (O) may be substituted for by another atom or an atom group as long as the electrically conductive mayenite compound has a C12A7 crystalline structure composed of calcium (Ca), aluminum (Al) and oxygen (O). For example, a part of calcium (Ca) may be substituted for by one or more atom(s) selected from a group consisting of magnesium (Mg), strontium (Sr), barium (Ba), lithium (Li), sodium (Na), chromium (Cr), manganese (Mn), cerium (Ce), cobalt (Co), nickel (Ni) and copper (Cu). Further, a part of aluminum (Al) may be substituted for by one or more atom(s) selected from a group consisting of silicon (Si), germanium (Ge), boron (B), gallium (Ga), titanium (Ti), manganese (Mn), iron (Fe), cerium (Ce), praseodymium (Pr), scandium (Sc), lanthanum (La), yttrium (Y), europium (Eu), ytterbium (Yb), cobalt (Co), nickel (Ni) and terbium (Tb). Further, the oxygen of the skeletal structure of the cages may be substituted for by nitrogen (N) or the like.

According to the embodiment, at least a part of free oxygen ions in the cases of the electrically conductive mayenite compound may be substituted for by anions such as $H^-$, $H_2^-$, $H^{2-}$, $O^-$, $O_2^-$, $OH^-$, $F^-$, $Cl^-$, $S^{2-}$ or the like, or anions of nitrogen (N).

The ratio of calcium (Ca) and aluminum (Al) in the electrically conductive mayenite compound of the embodiment, based on molar ratio as converted to CaO: $Al_2O_3$, is preferably within a range of 10:9 to 13:6, more preferably, within a range of 11:8 to 12.5:6.5, furthermore preferably, within a range of 11.5:7.5 to 12.3:6.7, yet furthermore preferably, within a range of 11.8:7.2 to 12.2:6.8 and particularly preferably, about 12:7. When a part of calcium (Ca) is substituted for by another atom, the number of moles of calcium and the other atom is assumed as the number of moles of calcium. When a part of aluminum (Al) is substituted for by another atom, the number of moles of aluminum and the other atom is assumed as the number of moles of aluminum.

According to the embodiment, when manufacturing the electrically conductive mayenite compound, the body to be processed including the mayenite compound is placed in the presence of carbon monoxide gas and aluminum vapor within a temperature range of 1080° C. to 1450° C. without being in contact with an aluminum source.

As described above, in the conventional method 2, if the electrically conductive mayenite compound and metal aluminum are heated at a temperature higher than or equal to the melting point, liquid aluminum is formed at a surface of the object to be processed. When the temperature of the body to be processed is lowered to room temperature under this state, a body of metal aluminum is adhered to the surface of the formed electrically conductive mayenite compound. Such an adhered body strongly bonds to the electrically conductive mayenite compound and it is not easy to peel or remove the adhered body. Thus, if such a phenomenon occurs, an additional process step is required when collecting the electrically conductive mayenite compound, which lacks productivity.

On the other hand, according to the method of manufacturing of the embodiment, the body to be processed is heated without being in contact with metal aluminum when the heat treatment is performed.

Thus, according to the method of manufacturing of the embodiment, the phenomenon that the body of metal aluminum or the like is adhered to the surface of the formed electrically conductive mayenite compound with a high electron density can be significantly prevented. Thus, according to the method of manufacturing of the embodiment, the electrically conductive mayenite compound with a high electron density that is generated after the heat treatment can be easily collected.

As such, according to the method of manufacturing, it is possible to manufacture the electrically conductive mayenite compound with a high electron density without lowering productivity.

(Example of Method of Manufacturing Electrically Conductive Mayenite Compound with High Electron Density of Embodiment)

An example of a method of manufacturing an electrically conductive mayenite compound with a high electron density of the embodiment is explained in detail with reference to drawings.

Figure 1:
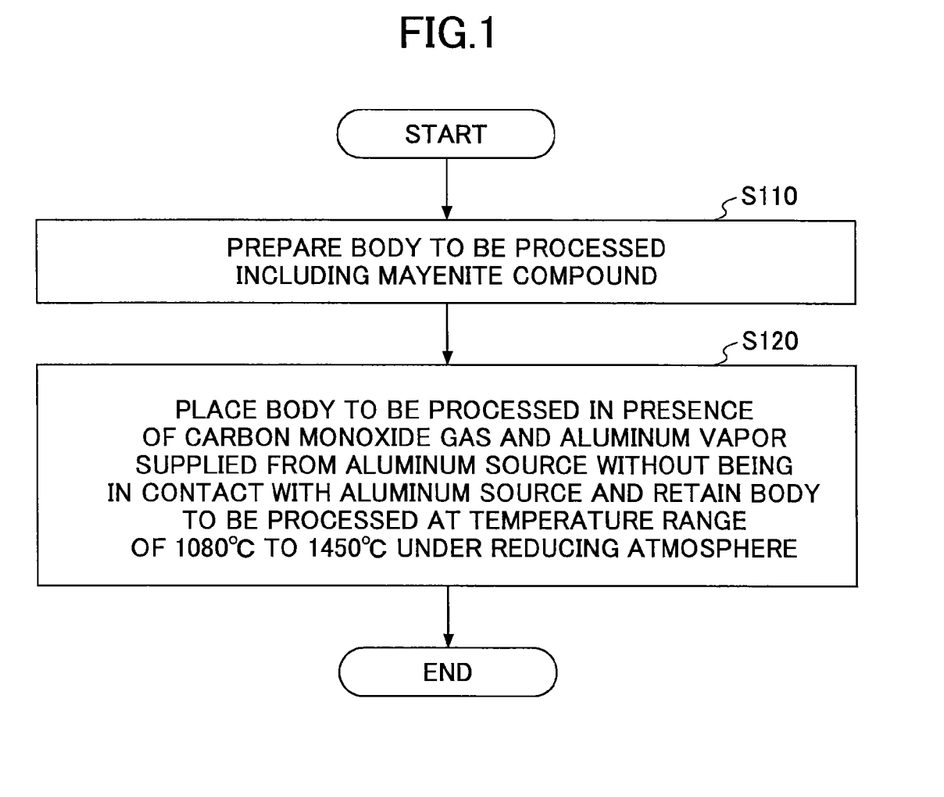
FIG. 1 is a flowchart schematically illustrating an example of a method of manufacturing an electrically conductive mayenite compound with a high electron density of an embodiment.

FIG. 1 illustrates an example of the method of manufacturing the electrically conductive mayenite compound with a high electron density of the embodiment.

As illustrated in FIG. 1, an example of the method of manufacturing the electrically conductive mayenite compound with a high electron density of the embodiment includes, (1) a step of preparing a body to be processed including a mayenite compound (step S110), and (2) a step of placing the body to be processed in the presence of carbon monoxide gas and aluminum vapor supplied from an aluminum source without being in contact with the aluminum source and retaining the body to be processed at a temperature range of 1080° C. to 1450° C. under a reducing atmosphere (step S120).

Each of the steps is explained in the following.

(Step S110)

First, a body to be processed including a mayenite compound is prepared.

The body to be processed may be, for example, (i) a compact body of a mayenite compound powder, or (ii) a sintered body of a mayenite compound.

A method of preparing the body to be processed of each of (i) and (ii) is explained.

(i) Method of Preparing Compact Body of Mayenite Compound Powder (Preparation of Mayenite Compound Powder)

When preparing a compact body of a mayenite compound powder, first, a raw material powder is prepared.

The raw material powder is prepared such that the ratio of calcium (Ca) and aluminum (Al) becomes within a range of 10:9 to 13:6 based on molar ratio as converted to CaO: $Al_2O_3$. It is preferable that CaO: $Al_2O_3$ (molar ratio) is within a range of 11:8 to 12.5:6.5, more preferably, within a range of 11.5:7.5 to 12.3:6.7, furthermore preferably, within a range of 11.8:7.2 to 12.2:6.8 and particularly preferably, about 12:7.

Here, the compound used for the raw material powder is not specifically limited as long as the ratio is held.

It is preferable that the raw material powder includes calcium aluminate, or at least two compounds selected from a group consisting of a calcium compound, an aluminum compound and calcium aluminate. The raw material powder may be the following mixed powder, for example, such as a mixed powder including a calcium compound and an aluminum compound, a mixed powder including a calcium compound and calcium aluminate, a mixed powder including an aluminum compound and calcium aluminate, a mixed powder including a calcium compound, an aluminum compound and calcium aluminate, or a mixed powder including only calcium aluminate.

For the calcium compound, calcium carbonate, calcium oxide, calcium hydroxide, calcium hydrogencarbonate, calcium sulfate, calcium metaphosphate, calcium oxalate, calcium acetate, calcium nitrate, calcium halide or the like may be used. Among these, calcium carbonate, calcium oxide, and calcium hydroxide are preferably used.

For the aluminum compound, aluminum hydroxide, aluminum oxide, aluminum sulfate, aluminum nitrate, aluminum halide or the like may be used. Among these, aluminum hydroxide and aluminum oxide are preferably used. For aluminum oxide (alumina), although there are α-alumina, γ-alumina, δ-alumina and the like, α-aluminum oxide (alumina) is preferably used.

For calcium aluminate, CaO. $Al_2O_3$, 3CaO. $Al_2O_3$, 5CaO. 3$Al_2O_3$, CaO. 2$Al_2O_3$, CaO. 6$Al_2O_3$ or the like is preferably used. C12A7 may be used by mixing with the calcium compound or the aluminum compound.

The raw material powder may further include a fluorine (F) component. For the fluorine (F) component, for example, calcium fluoride ($CaF_2$) or the like is used.

When the fluorine (F) component is added in the raw material powder, finally (after step S120), an electrically conductive mayenite compound with a high electron density or the like in which fluorine ions are introduced in cages can be manufactured.

The raw material powder including the fluorine (F) component may be prepared, although not limited so, for example, by adding calcium fluoride to the mixed powder of the calcium compound and the aluminum compound as described above.

The content of fluorine (F) in the raw material powder is not specifically limited. The content of fluorine (F) may be selected such that "x" is within a range of 0 to 0.60, for example, when the chemical formula of the finally obtainable electrically conductive mayenite compound is expressed as follows.

$$(12-x)CaO \cdot 7Al_2O_3 \cdot xCaF_2 \quad (2)$$

Next, the raw material powder prepared as described above is held at a high temperature and the mayenite compound is synthesized.

The synthesizing may be performed under an inert-gas atmosphere or in vacuum; but preferably, the synthesizing may be performed in air. The synthesizing temperature is not specifically limited; but, for example, is within a range of 1150° C. to 1460° C., and preferably, within a range of 1200° C. to 1415° C., more preferably, within a range of 1250° C. to 1400° C. and furthermore preferably, within a range of 1300° C. to 1350° C. When it is synthesized within a temperature range of 1150° C. to 1460° C., the mayenite compound including a large amount of a C12A7 crystalline structure can be easily obtained. When the synthesizing temperature is too low, there is a possibility that the amount of the C12A7 crystalline structure becomes small. On the other hand, when the synthesizing temperature is too high to exceed the melting point of the mayenite compound, there is a possibility that the amount of the C12A7 crystalline structure becomes small.

For the mayenite compound that does not include fluorine, it is more preferable that the synthesizing temperature is 1230° C. to 1415° C., more preferably, 1250° C. to 1380° C. and particularly preferably, 1280° C. to 1350° C. For the mayenite compound that includes fluorine, it is more preferable that the synthesizing temperature is 1180° C. to 1420° C., more preferably, 1200° C. to 1400° C. and particularly preferably, 1230° C. to 1380° C. As the mayenite compound including fluorine has a high melting point, the range of the synthesizing temperature becomes wide and the compound is easy to be manufactured.

The high temperature holding time is not specifically limited, and this varies in accordance with a synthesizing amount, holding temperature or the like. The holding time is, for example, 1 hour to 12 hours. The holding time is, for example, preferably, 2 hours to 10 hours, and more preferably, 4 hours to 8 hours. By holding the raw material powder at a high temperature for more than or equal to 1 hour, a solid phase reaction proceeds sufficiently to obtain a uniform mayenite compound.

The mayenite compound obtained by the synthesizing has a block-like structure in which a part or all is sintered. The block-like mayenite compound is processed with a milling process by a stamping mill or the like, for example, to be a size about 5 mm. Further, the mayenite compound may be processed with a milling process by an automatic mortar or a dry ball mill to form particles having an average particle size of about 10 μm to 100 μm. Here, the "average particle size" means a value obtained by a measurement using a laser diffraction/scattering method. Hereinafter, the average particle size of the powder means the measured value by a similar method. When further fine and uniform particles are to be obtained, for example, the average particle size of the powder can be refined to 0.5 μm to 50 μm by using a wet ball mill in which alcohol (for example, isopropyl alcohol) expressed as $C_nH_{2n+1}OH$ ("n" is integer more than or equal to 3) is used as solvent, or a circular bead mill or the like.

The mayenite compound powder is prepared by the above step.

The mayenite compound prepared as a powder may be an electrically conductive mayenite compound. This is because the electrically conductive mayenite compound has a better pulverizability than a non-electrically conductive compound.

A synthesizing method of the electrically conductive mayenite compound is not specifically limited, but the following methods may be used. For example, a method of manufacturing by putting a mayenite compound in a carbon container with a cover and performing a heat treatment at 1600° C. (WO 2005/000741), a method of manufacturing by putting a mayenite compound in a carbon container with a cover and performing a heat treatment at 1300° C. in nitrogen (WO 2006/129674), a method of manufacturing by putting a powder such as calcium aluminate or the like made from a calcium carbonate powder and an aluminum oxide powder in a carbon crucible with a cover and performing a heat treatment at 1300° C. in nitrogen (WO 2010/041558), a method of manufacturing a powder obtained by mixing a calcium carbonate powder and an aluminum oxide powder in a carbon crucible with a cover and performing a heat treatment at 1300° C. in nitrogen (Japanese Laid-open Patent Publication 2010-132467) or the like may be used.

A method of grinding the electrically conductive mayenite compound is similar to the method of grinding the mayenite compound.

With the above steps, the electrically conductive mayenite compound powder is prepared. Here, a mixed powder of a non-mayenite compound and the electrically conductive mayenite compound may be used.

(Preparation of Compact Body of Mayenite Compound Powder)

Next, a compact body including the mayenite compound powder prepared by the method as described above is prepared. The compact body may be prepared by pressing a molding material including a powder or a kneaded body including a powder.

The compact body may be obtained by pressing, sheet forming, extrusion molding or injection molding of the molding material. The shape of the compact body is not specifically limited.

(ii) Preparation of Sintered Body of Mayenite Compound

Even when preparing the sintered body of the mayenite compound, a part of the method explained in the above described "(i) Method of preparing compact body of mayenite compound powder" may be used.

For example, by the method explained in the above described "(Preparation of mayenite compound powder)", the raw material powder is held at a high temperature and the mayenite compound is synthesized. The block-like mayenite compound obtained after this synthesizing may be used as a sintered body for the body to be processed as it is.

Alternatively, a sintered body obtained by heat-processing the compact body explained in "(Preparation of compact body of mayenite compound powder)" of "(i) Method of preparing compact body of mayenite compound powder" may be used as the body to be processed.

For the latter case, the heat process condition is not specifically limited as long as the compact body is sintered. The heat treatment may be performed, for example, in air at a temperature range of 300° C. to 1450° C. When the temperature is greater than or equal to 300° C., the sintering process can easily proceed as the organic component is volatilized and contacting points of the powder increase, and when the temperature is less than or equal to 1450° C., it is easy to retain the shape of the sintered body. The maximum temperature of the heat treatment is in about range of 1000° C. to 1420° C., preferably, 1050° C. to 1415° C., more preferably, 1100° C. to 1380° C. and furthermore preferably, 1250° C. to 1350° C.

The holding time at the maximum temperature in the heat treatment is within a range of about 1 hour to 50 hours, preferably, 2 hours to 40 hours, and furthermore preferably, 3 hours to 30 hours. Further, although even when the holding time is longer, there is no problem in characteristics of the obtained sintered body, it is preferable that the holding time is within 48 hours in a viewpoint of manufacturing cost. The heat treatment may be performed in inert-gas such as argon, helium, neon, nitrogen or the like, in oxygen gas, in an atmosphere of mixture thereof, or in vacuum.

In addition to this, the sintered body of the mayenite compound may be prepared by various methods. Here, the mayenite compound included in the sintered body may be the electrically conductive mayenite compound or the non-electrically conductive mayenite compound. Further, the mayenite compound included in the sintered body may be the mayenite compound including fluorine or the mayenite compound that does not include fluorine.

Here the explanation of the above described (i) and (ii) of preparing the body to be processed is just an example, and it should be apparent for those skilled in the art to prepare the body to be processed using other methods.

(Step S120)

Next, the body to be processed including the mayenite compound obtained in the above described step S110 is performed with a heat treatment.

As described above, when performing the heat treatment, the body to be processed is placed in the presence of carbon monoxide gas and aluminum vapor supplied from the aluminum vapor source without being in contact with the aluminum source.

The heat treatment of the body to be processed is performed under a reducing atmosphere. Here, the "reducing atmosphere" is a generic name for an atmosphere in which the partial pressure of oxygen in the environment is less than or equal to $10^{-3}$ Pa, and the environment may be an inert-gas atmosphere, or a reduced pressure environment (vacuum environment whose pressure is less than or equal to 100 Pa, for example). The partial pressure of oxygen is, preferably, less than or equal to $10^{-5}$ Pa, more preferably, less than or equal to $10^{-10}$ Pa, and furthermore preferably, less than or equal to $10^{-15}$ Pa.

The aluminum vapor source is not specifically limited, but may be, for example, a layer of an aluminum powder, in a granular form, or in a block form. Here, as described above, it should be noted that the body to be processed is placed in the presence of aluminum vapor without directly contacting the aluminum vapor source.

The carbon monoxide gas may be provided from outside to the environment where the body to be processed is placed, but a container containing carbon may be used, for example, and the body to be processed may be placed in the container containing carbon. At this time, the carbon monoxide gas is provided from the container containing carbon when the body to be processed is performed with the heat treatment. Alternatively, another member that can be a CO source may be used.

The heat treatment may be performed at a state where the body to be processed and the aluminum layer are placed in a carbon container with a cover in order to supply carbon monoxide gas and aluminum vapor, for example. Here, it is preferable that the aluminum vapor source and the carbon container do not directly contact each other. This is because if both materials are held at a high temperature while contacting each other, both the materials react with each other at a contacting portion, and it becomes difficult to supply a sufficient amount of aluminum vapor and carbon monoxide gas to the reaction environment. The aluminum vapor source and the carbon container may be separated by a separator made of such as alumina or the like.

A method of adjusting the reaction environment to a reducing atmosphere when performing the high temperature treatment on the body to be processed is not specifically limited.

For example, the container containing carbon may be placed at a vacuum atmosphere whose pressure is less than or equal to 100 Pa. In this case, the pressure is, preferably, less than or equal to 60 Pa, more preferably, less than or equal to 40 Pa, and furthermore preferably, less than or equal to 20 Pa.

Alternatively, an inert-gas atmosphere (however, except nitrogen gas) in which partial pressure of oxygen is less than or equal to 1000 Pa may be supplied to the container containing carbon. At this time, the partial pressure of oxygen in the supplied inert-gas atmosphere is, preferably, less than or equal to 100 Pa, more preferably, less than or equal to 10 Pa, furthermore preferably, less than or equal to 1 Pa, and particularly preferably, less than or equal to 0.1 Pa.

The inert-gas atmosphere may be an argon gas atmosphere or the like. However, it is not preferable to use nitrogen gas as the inert-gas in the present invention. Nitrogen gas reacts with aluminum vapor that exists in the reaction environment in the invention to generate aluminum nitride. Thus, if aluminum nitride is generated, aluminum vapor necessary for reducing the mayenite compound is hardly supplied.

The heat process temperature is within a range of 1080 C. to 1450° C. If the heat process temperature is less than 1080° C., there is a possibility that sufficient electrical conductivity is not given to the mayenite compound. Further, if the heat process temperature is more than 1450° C., which exceeds the melting point of the mayenite compound, the crystalline structure decomposes to lower the electron density. It is preferable to perform the heat treatment at less than or equal to 1380° C. as it is easier to obtain an electrically conductive mayenite compound with a desired shape. Further, it is more preferable to perform the heat treatment at less than or equal to 1350° C. for stability of the shape.

For the body to be processed that does not include the fluorine component, it is preferable that the heat process temperature is 1230° C. to 1415° C., more preferably, 1250° C. to 1380° C., and furthermore preferably, 1280° C. to 1350° C. It is preferable to perform the heat treatment at less than or equal to 1380° C. as it is easier to obtain an electrically conductive mayenite compound with a desired shape. Further, it is more preferable to perform the heat treatment at less than or equal to 1350° C. for stability of the shape. For the body to be processed including the fluorine component, it is preferable that the heat process temperature is 1180° C. to 1420° C., more preferably, 1200° C. to 1400° C., and furthermore preferably, 1230° C. to 1380° C. When the body to be processed includes the fluorine component, the adaptable range of the heat process temperature is spread, and it is easy to control manufacturing.

The high temperature holding time for the body to be processed is, preferably, within a range of 30 minutes to 50 hours, more preferably, within a range of 1 hour to 40 hours, furthermore preferably, within a range of 2 hours to 30 hours, and particularly preferably, within a range of 2 hours to 25 hours. When the holding time of the body to be processed is less than 30 minutes, there is a possibility that the electrically conductive mayenite compound with a sufficient high electron density cannot be obtained and sintering is not sufficient so that the obtained sintered body may be easily broken. Further, even when the holding time becomes longer, there is no problem in its characteristics; however, it is preferable that the holding time is less than or equal to 50 hours so that a desired shape of the mayenite compound can be easily held. Further, it is more preferable that the holding time is less than or equal to 40 hours in a viewpoint of not wasting energy.

With the above steps, the electrically conductive mayenite compound with a high electron density of greater than or equal to $3.0 \times 10^{20}$ cm$^{-3}$ can be manufactured. Here, when the body to be processed including the fluorine component is used in step S110, the electrically conductive mayenite compound with a high electron density including fluorine is manufactured. In this case, fluorine may be introduced into a cage or may be introduced into a framework of the cages.

Figure 2:
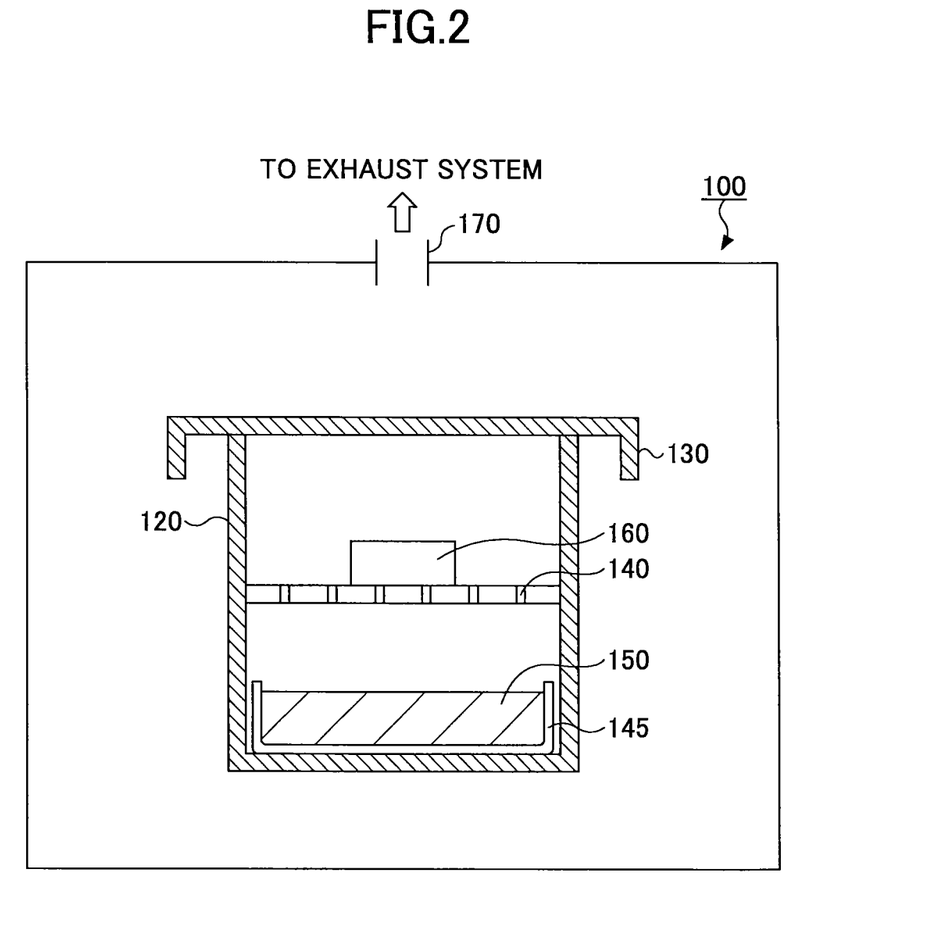
FIG. 2 is a view schematically illustrating an example of a structure of an apparatus that is used when performing a heat treatment on a body to be processed.

FIG. 2 schematically illustrates an example of a structure of an apparatus that is used when performing the heat treatment on the body to be processed.

The entirety of an apparatus 100 is configured with a heat-resisting closed container, and an exhaust port 170 is connected to an exhaust system.

The apparatus 100 includes a carbon container 120 whose upper portion is opened, a carbon cover 130 placed on an upper portion of the carbon container 120, and a partition plate 140 placed in the carbon container 120, in a heat-resisting closed container. A metal aluminum powder layer 150 is placed on a heat-resisting tray (an alumina tray, for example) 145 that is mounted at a bottom portion of the carbon container 120, as an aluminum vapor source.

A body to be processed 160 is placed on an upper portion of the partition plate 140. The partition plate 140 has a structure in which the aluminum vapor from the layer 150 is not suppressed to reach the body to be processed 160. Further, it is necessary to form the partition plate 140 with a material that does not react with aluminum vapor or the body to be processed 160 when performing the high temperature treatment. For example, the partition plate 140 is an alumina plate provided with a lot of through-holes.

The carbon container 120 and the carbon cover 130 function as a supply source of carbon monoxide gas when performing the high temperature treatment on the body to be processed 160. It means that when the body to be processed 160 is held at a high temperature, carbon monoxide gas is generated from the carbon container 120 and the carbon cover 130.

The carbon monoxide gas inhibits generation of an aluminum oxide layer at a surface of the mayenite compound and forms aluminum carbide or the like. Specifically, in addition to aluminum carbide such as aluminum carbide ($Al_4O_3$, for example), aluminum carbide oxide ($Al_4O_4C$, for example) or the like, aluminum oxide ($Al_2O_3$, for example), calcium aluminate ($CaAl_{12}O_{19}$, for example), or a complex of them is formed at the surface of the mayenite compound.

The free oxygen ions in the cages of the mayenite compound are reduced by aluminum vapor by the following reaction.

$$3O^{2-}+2Al \rightarrow 6e^-+Al_2O_3 \qquad (3)$$

Thus, by holding the body to be processed 160 at the high temperature using the apparatus 100, the mayenite compound is sintered and electrons can be introduced into cages of the sintered mayenite compound.

Here, the apparatus structure illustrated in FIG. 2 is just an example, and it should be apparent for those skilled in the art to perform a high temperature treatment on the body to be processed using other apparatuses.

(Target for Film Deposition Made of Example of Electrically Conductive Mayenite Compound with High Electron Density of Embodiment)

When the example of the method of manufacturing of the embodiment is used, for example, a target (sputtering target, for example) that is used in depositing a film by a vapor deposition method can be manufactured. This target is structured by the electrically conductive mayenite compound with a high electron density.

As described above, according to the method described in Patent Document 2, the body to be processed is soaked in melted aluminum generated by aluminum particles that are melted when performing the heat treatment. Thus, a problem occurs that an adhered body of aluminum strongly bonds to a surface of the body to be processed after the heat treatment.

Further, as such an adhered body is fixed to the container used in the heat treatment, it is difficult to collect the body to be processed without damaging the body to be processed. In particular, when the size of the body to be processed is large, it is extremely difficult to collect the body to be processed without damaging it.

With such a problem, it has been difficult to manufacture a large size product structured by an electrically conductive mayenite compound with a high electron density, such as a target whose minimum size is greater than or equal to 5 mm, so far.

However, according to an embodiment of the present invention, a film deposition target including the electrically conductive mayenite compound whose electron density is greater than or equal to $3 \times 10^{20}$ cm$^{-3}$ and whose minimum size is greater than or equal to 5 mm can be easily manufactured. A disk flat target whose diameter is preferably greater than or equal to 50 mm, more preferably, greater than or equal to 75 mm, furthermore preferably, greater than or equal to 100 mm, and particularly preferably, greater than or equal to 200 mm may be manufactured. A rectangular flat target whose length is preferably greater than or equal to 50 mm, more preferably, greater than or equal to 75 mm, furthermore preferably, greater than or equal to 100 mm, and particularly preferably, greater than or equal to 200 mm may be manufactured. A cylindrical target whose height of cylinder is preferably greater than or equal to 50 mm, more preferably, greater than or equal to 75 mm, furthermore preferably, greater than or equal to 100 mm, and particularly preferably, greater than or equal to 200 mm may be manufactured.

It is preferable that the electron density or the relative density of the film deposition target is higher. It is preferable that the electron density is greater than or equal to $5.0 \times 10^{20}$ cm$^{-3}$, more preferably, greater than or equal to $1.0 \times 10^{21}$ cm$^{-3}$, furthermore preferably, greater than or equal to $1.3 \times$ $10^{21}$ cm$^{-3}$, and particularly preferably, $1.5 \times 10^{21}$ cm$^{-3}$. It is preferable that the relative density is greater than or equal to 90%, furthermore preferably, greater than or equal to 93%, and particularly preferably, greater than or equal to 95%.

When forming a thin film on a substrate using a film deposition target of the embodiment by a vapor deposition method under an atmosphere in which partial pressure of oxygen is less than 0.1 Pa, an amorphous thin film including electrons can be formed. An amorphous thin film including electrons within a range of the electron density greater than or equal to $2 \times 10^{18}$ cm$^{-3}$ and less than or equal to $2.3 \times 10^{21}$ cm$^{-3}$ can be obtained. The amorphous thin film may be formed by an amorphous solid material including calcium, aluminum and oxygen. In other words, when forming a thin film on a substrate using a film deposition target of the embodiment by a vapor deposition method under an atmosphere in which partial pressure of oxygen is less than 0.1 Pa, an amorphous oxide electride thin film including calcium and aluminum may be formed.

The obtained amorphous thin film absorbs light at a photon energy level of 4.6 eV. The electron density of the obtained amorphous thin film may be greater than or equal to $1 \times 10^{19}$ cm$^{-3}$ or may be greater than or equal to $1 \times 10^{20}$ cm$^{-3}$. The work function of the obtained amorphous thin film may be 2.8 to 3.2 eV. The ratio of the optical absorption coefficient at a photon energy level of 4.6 eV with respect to the optical absorption coefficient at a photon energy level of 3.3 eV of the obtained amorphous thin film may be less than or equal to 0.35. The concentration of F$^+$ center of the obtained amorphous thin film may be less than $5 \times 10^{18}$ cm$^{-3}$.

A thin film as an electron injection layer of an organic EL element may be formed by using the film deposition target of the embodiment.

EXAMPLES

Next, examples of the embodiment are explained. Examples 1 to 16 are working examples of the embodiment and Examples 51 to 55 are relative examples.

Example 1

The electrically conductive mayenite compound with a high electron density was manufactured by the following method.
(Syntheses of Mayenite Compound)

First, 313.5 g of a calcium carbonate powder (CaCO$_3$, manufactured by KANTO CHEMICAL Co., Inc., special grade) and 186.5 g of an aluminum oxide powder ($\alpha$-Al$_2$O$_3$, manufactured by KANTO CHEMICAL Co., Inc., special grade) were mixed such that calcium oxide (CaO): aluminum oxide (Al$_2$O$_3$) became 12:7 by molar ratio conversion. Next, the mixed powder was heated in air to 1350° C. at a temperature rising rate of 300° C./hour, and held at 1350° C. for 6 hours. Thereafter, the mixed powder was cooled at a cooling rate of 300° C./hour to obtain about 362 g of a white block body.

Next, after grinding the white block body by an alumina stamping mill to be flakes of about 5 mm, further, the flakes were roughly ground by an alumina automatic mortar mill to obtain a white particles A1. By measuring the granularity of the obtained white particles A1 by a laser diffraction/scattering method (SALD-2100, manufactured by Shimadzu Corporation), the average particle size of the obtained white particle A1 was 20 µm.

Next, 300 g of the white particle A1, 3 kg of zirconia balls having a diameter of 5 mm, and 800 ml of industrial EL grade isopropyl alcohol as a milling solvent were put in a 7 liter zirconia container, and milled with a ball mill milling process at a rotation speed of 72 rpm for 16 hours after placing a zirconia cover on the container.

After the process, the obtained slurry was filtered under suction to remove the milling solvent. Further, the remaining material was put into an oven at 80° C. and dried for 10 hours. With this, a white powder B 1 was obtained. As a result of X-ray diffraction analysis, it was confirmed that the obtained white powder B 1 had the C12A7 structure. Further, by the above described laser diffraction/scattering method, it was revealed that the average particle size of the obtained white powder B 1 was 1.5 µm.
(Manufacturing Compact Body of Mayenite Compound)

The white powder B 1 (7 g) obtained by the above described method was spread in a mold having a length of 40 mm and a width of 20 mm and a height of 30 mm. The molding was performed with a uni-axial press at a pressure of 10 MPa for 1 minute. Further, the molding was performed with a cold isostatic pressing at a pressure of 180 MPa to obtain a compact body C1 having a length of about 38 mm and a width of about 19 mm and a height of about 6 mm.
(Manufacturing Non-Electrically Conductive Sintered Body of Mayenite Compound)

The compact body C1 obtained by the above method was placed on an alumina plate and heated to 1100° C. in air to sinter the compact body C1. The temperature rising rate was 300° C./hour. Next, after holding the compact body C1 at 1100° C. for 2 hours, it was cooled to a room temperature at a decreasing rate of 300° C./hour. With this, a sintered body D1 was obtained.

The apparent porosity of the sintered body D1 was 31%. The sintered body D 1 obtained as such was processed into a rectangular solid having a length of 19 mm and a width of 8 mm and a thickness of 5 mm and was used as the body to be processed.
(Manufacturing Electrically Conductive Mayenite Compound)

Figure 3:
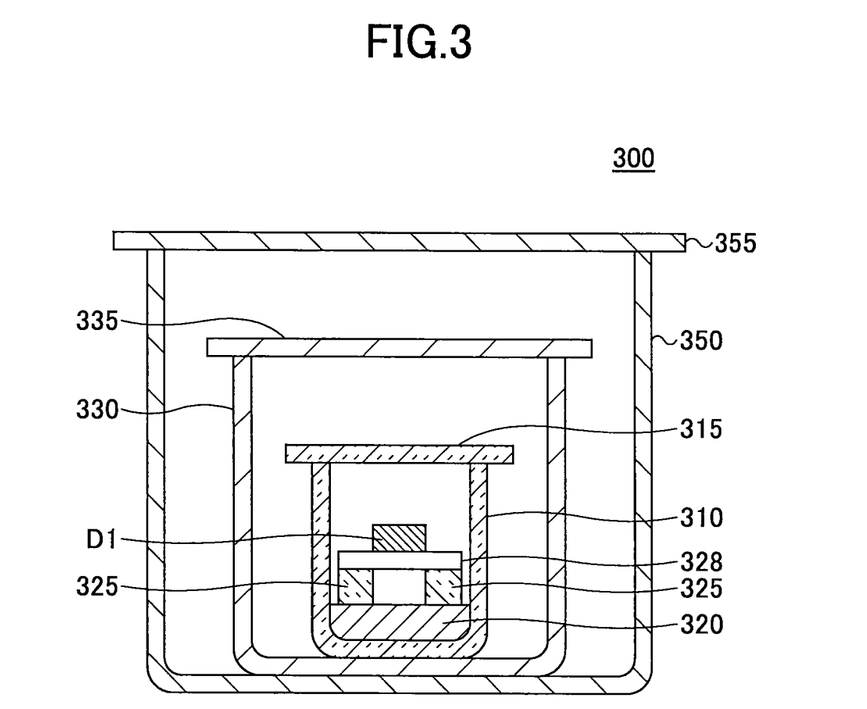
FIG. 3 is a view schematically illustrating an example of a structure of an apparatus that was used when preforming a heat treatment on a sintered body D1 of Example 1.

Next, the sintered body D 1 was performed with a heat treatment at a high temperature using an apparatus illustrated in FIG. 3 and the electrically conductive mayenite compound with a high electron density was manufactured.

FIG. 3 illustrates an apparatus that was used for the heat treatment of the sintered body D 1. As illustrated in FIG. 3, the apparatus 300 includes an alumina container 310 with an alumina cover 315, a first carbon container 330 with a carbon cover 335 and a second carbon container 350 with a carbon cover 355. Further, an aluminum layer 320 configured by spreading 3 g of a metal aluminum powder (manufactured by Junsei Chemical Co., Ltd., 200 mesh) is placed at a bottom portion of the alumina container 310. The aluminum layer 320 functions as the aluminum vapor source that generates aluminum vapor when the apparatus 300 is heated at a high temperature.

The alumina container 310 has a substantially cylindrical shape whose external diameter is 40 mm and internal diameter is 38 mm and height is 40 mm. Further, the first carbon container 330 has a substantially cylindrical shape whose external diameter is 60 mm and internal diameter is 50 mm and height is 60 mm and the second carbon container 350 has a substantially cylindrical shape whose external diameter is 80 mm and internal diameter is 70 mm and height is 75 mm.

The apparatus 300 was used as follows.

First, the sintered body D 1, that was the body to be processed, was placed in the alumina container 310. At this time, two alumina blocks 325 having the same shape were placed on the aluminum layer 320, and an alumina plate 328 whose thickness is 1 mm was further placed on the alumina blocks 325. After placing the sintered body D1 on the alumina plate 328, the cover 315 was placed on the alumina container 310. Under this state, the sintered body D 1 did not directly contact the aluminum layer 320.

Next, the apparatus 300 was provided in an atmosphere adjustable electric furnace. Further, the furnace was evacuated by a rotary pump and a mechanical booster pump. Thereafter, after the pressure in the furnace became less than or equal to 20 Pa at a room temperature, the apparatus 300 was started to be heated to 1300° C. at a temperature rising rate of 300° C./hour. After holding the apparatus 300 for 6 hours at 1300° C., the apparatus 300 was cooled to a room temperature at a temperature decreasing rate of 300° C./hour.

After this heat treatment, a black material E 1 whose surface was black was obtained. The black material E 1 could easily be collected from the apparatus 300. Here, the relative density of the black material El was 97.9%.

(Evaluation)

Next, a sample for measuring electron density was extracted from the black material E 1. The sample was obtained by roughly grinding the black material E 1 using the alumina automatic mortar mill to obtain rough particles, and extracting a portion of the black material E 1 corresponding to a center portion.

The obtained sample was dark brown nearly black. As a result of the X-ray diffraction analysis, it was revealed that the powder only included the C12A7 structure. Further, the electron density obtained from a peak position of the light diffusion reflection spectrum of the obtained powder was $1.6 \times 10^{21}$ cm$^{-3}$.

With this, it was confirmed that the black material E1 was a sintered body of the electrically conductive mayenite compound with a high electron density.

Example 2

Similar to the above described method of Example 1, the electrically conductive mayenite compound with a high electron density was manufactured. However, in the step of (Manufacturing electrically conductive mayenite compound), the heat process temperature was 1250° C.

With this, a black material whose surface was black was obtained. The black material could easily be collected.

Example 3

Similar to the above described method of Example 1, the electrically conductive mayenite compound with a high electron density was manufactured. However, in the step of (Manufacturing electrically conductive mayenite compound), the holding time of the heat treatment was 2 hours.

With this, a black material whose surface was black was obtained. The black material could easily be collected.

Example 4

Similar to the above described method of Example 1, the electrically conductive mayenite compound with a high electron density was manufactured. However, in the step of (Manufacturing electrically conductive mayenite compound), the holding time of the heat treatment was 12 hours.

With this, a black material whose surface was black was obtained. The black material could easily be collected.

Example 5

Similar to the above described method of Example 1, the electrically conductive mayenite compound with a high electron density was manufactured. However, in the step of (Manufacturing electrically conductive mayenite compound), the heat process temperature was 1380° C.

With this, a black material whose surface was black was obtained. The black material could easily be collected.

Example 6

Similar to the above described method of Example 1, the electrically conductive mayenite compound with a high electron density was manufactured. However, the metal aluminum layer 320 used in Example 1 was used again as the aluminum vapor source in the step of (Manufacturing electrically conductive mayenite compound). Here, as the metal aluminum powder composing the aluminum layer 320 was fused and solidified, the aluminum layer 320 was in a block-like structure in Example 6.

With this, after the above described step of (Manufacturing electrically conductive mayenite compound), a black material whose surface was black was obtained. The black material could easily be collected.

Further, with this result, it was revealed that the aluminum layer 320 can be recycled. Further, it was confirmed that almost the same electrically conductive mayenite compound with a high electron density was obtained after repeatedly using the aluminum layer 320 for 10 times in the apparatus 300 by the following experiments.

Example 7

Similar to the above described method of Example 1, the electrically conductive mayenite compound with a high electron density was manufactured. However, in the step of (Manufacturing electrically conductive mayenite compound), the pressure in the electric furnace at room temperature was 50 Pa.

With this, a black material whose surface was black was obtained. The black material could easily be collected.

Example 8

Similar to the above described method of Example 1, the electrically conductive mayenite compound with a high electron density was manufactured. However, a plate compact body having a length of 55 mm and a width of 55 mm and a thickness of 5 mm was used as the body to be processed. Further, the sizes of the carbon container and the alumina container of Example 1 in the step of (Manufacturing electrically conductive mayenite compound) were changed. The compact body was manufactured as follows.

A granulated powder was previously manufactured by mixing the mayenite compound powder and a vehicle at a weight ratio of 10:1.5 by an automatic mortar. At this time, the vehicle was liquid obtained by dissolving polyvinyl butyral (BM-S, manufactured by SEKISUI CHEMICAL CO., LTD.) in organic solvent at 10 weight % as a solid content. The organic solvent was a mixture of toluene, isopropyl alcohol and butanol at a weight ratio of 6:3:1. The polyvinyl butyral also has a function as a binder that increases firmness of the compact body.

22 g of the granulated powder was spread in a mold having a length 60 mm and a width 60 mm and a height 50 mm and performed with a uni-axial press at a pressure of 10

MPa for 1 minute. The compact body was dried in an oven at 80° C. for an hour to volatilize the solvent in the obtained compact body. Further, the molding was performed with a cold isostatic pressing (CIP) at a pressure of 180 MPa for a minute to obtain a plate compact body having a length of 55 mm and a width of 55 mm and a thickness of 5 mm. This compact body was used as the body to be processed.

With this, a black material whose surface was black was obtained. The black material could easily be collected.

As a result of the X-ray diffraction analysis, it was revealed that the black material of each of Examples 2 to 8 collected by a method similar to that of Example 1 only included the C12A7 structure. Further, the relative density and the electron density of the black material of each of Examples 2 to 8 are illustrated in Table 1. With the above fact, it was confirmed that the black material of each of Examples 2 to 8 was a sintered body of the electrically conductive mayenite compound with a high electron density.

Example 9

Similar to the above described method of Example 1, the electrically conductive mayenite compound with a high electron density was manufactured. However, in the step of (Manufacturing compact body of mayenite compound), the compact body was prepared using a mixed powder including a fluorine component instead of the powder B1 and the electrically conductive mayenite compound with a high electron density including fluorine was finally manufactured.

(Method of Preparing Compact Body)

First, 0.73 g of a calcium fluoride powder ($CaF_2$, manufactured by KANTO CHEMICAL Co., Inc., special grade) and 0.55 g of an aluminum oxide powder ($\alpha$-$Al_2O_3$, manufactured by KANTO CHEMICAL Co., Inc., special grade) were added to 38.72 g of the powder B 1 obtained by the method described at (Syntheses of mayenite compound) of Example 1, and then sufficiently mixed to obtain a mixed powder F.

When it is assumed that the composition ratio of Ca/Al/F of the mixed powder F9 is maintained in a finally manufactured mayenite compound, the manufactured mayenite compound is expressed by a chemical formula as follows. In particular, x=0.32.

$$(12-x)CaO. 7Al_2O_3.xCaF_2 \quad (4)$$

Next, 7 g of the mixed powder F9 was spread in a mold having a length of 40 mm and a width of 20 mm and a height of 30 mm. Further, the molding was performed with a uni-axial press at a pressure of 10 MPa for 1 minute. Further, the molding was performed with a cold isostatic pressing at a pressure of 180 MPa. With this, a compact body C9 having a length of about 38 mm and a width of about 19 mm and a height of about 6 mm was formed. Next, the compact body C9 was cut into a rectangular solid shape having a length of 19 mm and a width of 8 mm and a thickness of 6 mm by a commercially available cutter to be used as a body to be processed.

With this, a black material E 9 whose surface was whitish was obtained. The black material E 9 could be easily collected. The relative density of the black material E 9 was 97.0%.

As a result of the X-ray diffraction analysis by a method similar to that of Example 1, the collected black material E 9 of the sample only included the C12A7 structure. Further, the electron density of the black material E 9 was $1.2 \times 10^{21}$ $cm^{-3}$.

Next, as a result of measuring the lattice constant of the black material E 9, the lattice constant of the black material E 9 was smaller than the value of the black material E 1 of Example 1. It is considered that the mayenite compound includes fluorine.

Next, the black material E 9 was broken and a composition analysis of the broken surface was conducted by an energy-dispersive X-ray analysis (EDX). It was revealed by the analysis that the detected ratio of fluorine was close to the mixture ratio of the mixed powder F9.

As such, it was confirmed that the black material E 9 was a sintered body of an electrically conductive mayenite compound with a high electron density including fluorine.

Example 10

Similar to the above described method of Example 9, the electrically conductive mayenite compound with a high electron density was manufactured. However, in the step of (Manufacturing electrically conductive mayenite compound), the heat process temperature of the body to be processed was 1100° C.

With this, a black material whose surface was whitish was obtained. The black material could easily be collected.

Example 11

Similar to the above described method of Example 9, the electrically conductive mayenite compound with a high electron density was manufactured. However, in the step of (Manufacturing electrically conductive mayenite compound), the heat process temperature of the body to be processed was 1380° C.

With this, a black material whose surface was whitish was obtained. The black material could easily be collected.

Example 12

Similar to the above described method of Example 9, the electrically conductive mayenite compound with a high electron density was manufactured. However, in the step of (Method of preparing compact body), 1.07 g of a calcium fluoride powder ($CaF_2$, manufactured by KANTO CHEMICAL Co., Inc., special grade) and 0.82 g of an aluminum oxide powder ($\alpha$-$Al_2O_3$, manufactured by KANTO CHEMICAL Co., Inc., special grade) were added to 38.11 g of the powder B, and then sufficiently mixed to obtain a mixed powder F12.

When it is assumed that the composition ration of Ca/Al/F of the mixed powder F12 is maintained in a finally manufactured mayenite compound, the manufactured mayenite compound is expressed by the above described chemical formula (4), and in particular, x=0.48. Other than using the mixed powder F12 instead of the mixed powder F9 of Example 9, the body to be processed was obtained by a method similar to that in Example 9 and was used. Here, the heat process temperature of the body to be processed was 1420° C.

With this, a black material whose surface was whitish was obtained. The black material could easily be collected.

Example 13

Similar to the above described method of Example 9, the electrically conductive mayenite compound with a high electron density was manufactured. However, in the step of (Method of preparing compact body), 0.12 g of a calcium fluoride powder (CaF$_2$, manufactured by KANTO CHEMICAL Co., Inc., special grade) and 0.09 g of an aluminum oxide powder (α-Al$_2$O$_3$, manufactured by KANTO CHEMICAL Co., Inc., special grade) were added to 39.78 g of the powder B 1, and then sufficiently mixed to obtain a mixed powder F13.

When it is assumed that the composition ratio of Ca/Al/F of the mixed powder F13 is maintained in a finally manufactured mayenite compound, the manufactured mayenite compound is expressed by the above described chemical formula (4), and in particular, x=0.06. Other than using the mixed powder F13 instead of the mixed powder F9 of Example 9, the body to be processed was obtained by a method similar to that in Example 9 and was used.

With this, a black material whose surface was whitish was obtained. The black material could easily be collected.

Example 14

Similar to the above described method of Example 9, the electrically conductive mayenite compound with a high electron density was manufactured. However, a plate compact body having a length of 55 mm and a width of 55 mm and a thickness of 5 mm was used as the body to be processed. Further, in the step of (Manufacturing electrically conductive mayenite compound) of Example 9, the sizes of the carbon container and the alumina container were changed. The compact body was manufactured as follows.

A granulated powder was previously manufactured by mixing the mixed powder F9 of Example 9 and a vehicle at a weight ratio of 10:1.5 by an automatic mortar. At this time, the vehicle was liquid obtained by dissolving polyvinyl butyral (BM-S, manufactured by SEKISUI CHEMICAL CO., LTD.) in organic solvent at 10 weight % as a solid content. The organic solvent was a mixture of toluene, isopropyl alcohol and butanol at a weight ratio of 6:3:1. The polyvinyl butyral also has a function as a binder that increases firmness of the compact body.

22 g of the granulated powder was spread in a mold having a length of 60 mm and a width of 60 mm and a height of 50 mm and performed with a uni-axial press at a pressure of 10 MPa for 1 minute. The compact body was dried in an oven at 80° C. for an hour to volatilize the solvent in the obtained compact body. Further, the molding was performed with a cold isostatic pressing at a pressure of 180 MPa to obtain a plate compact body having a length of 55 mm and a width of 55 mm and a height of 5 mm. This compact body was used as the body to be processed.

With this, a black material whose surface was whitish was obtained. The black material could easily be collected.

Example 15

Similar to the above described method of Example 9, the electrically conductive mayenite compound with a high electron density was manufactured. However, the following step is additionally performed on the compact body C9 obtained in the step of (Method of preparing compact body).
(Manufacturing Non-Electrically Conductive Sintered Body of Mayenite Compound)

The compact body C9 obtained by the above method was placed on an alumina plate and heated to 1200° C. in air in order to sinter the compact body C9. The temperature rising rate was 300° C./hour. Next, after holding the compact body C9 at 1200° C. for 2 hours, the compact body C9 was cooled to a room temperature at a decreasing rate of 300° C./hour. With this, a sintered body D 15 was obtained.

The apparent porosity of the sintered body D 15 was 31%. The sintered body D 15 obtained as such was processed into a rectangular solid having a length of 19 mm and a width of 8 mm and a thickness of 5 mm and was used as the body to be processed.

With this, a black material whose surface was whitish was obtained. The black material could easily be collected.

Example 16

Similar to the above described method of Example 15, the electrically conductive mayenite compound with a high electron density was manufactured. However, in the step of (Manufacturing non-electrically conductive sintered body of mayenite compound), the compact body C9 was sintered at 1380° C.

With this, a black material whose surface was whitish was obtained. The black material could easily be collected.

As a result of the X-ray diffraction analysis of each of Examples 10 to 16, similar to the above described method of Example 1, it was revealed that the black material of the collected sample only includes the C12A7 structure. Further, as a result of measuring the lattice constant of the black material, the lattice constant of the black material was smaller than a value of the black material D1 of Example 1. With this, it can be considered that the mayenite compound includes fluorine. Further, the black material was broken and a composition analysis of the broken surface was conducted. It was revealed by the analysis that the detected ratio of fluorine was close to the mixture ratio of the mixed powder used as a source material. Further, the relative density and the electron density of the black material of each of Examples 10 to 16 are illustrated in Table 1. With this, it was confirmed that the black material of each of Examples 10 to 16 was a sintered body of an electrically conductive mayenite compound with a high electron density.

Example 51

Similar to the above described method of Example 9, manufacturing of an electrically conductive mayenite compound with a high electron density was tried. However, in the step of (Manufacturing electrically conductive mayenite compound), the heat process temperature was 1460° C.

With this, after the above described step of (Manufacturing electrically conductive mayenite compound), a black material E 51 whose surface was whitish was obtained. The black material E 51 was extremely deformed. Further, the black material E 51 was gassed and it was difficult to measure the relative density.

Further, as a result of the X-ray diffraction analysis of a powder obtained by grinding the black material E 51 similar to the above described method of Example 1, it was revealed that the black material E 52 only included the C12A7 structure. However, the electron density of the black material E 51 was 4.4×10$^{19}$ cm$^{-3}$.

With this, it was confirmed that the black material E51 was not the electrically conductive mayenite compound with a high electron density.

Example 52

Similar to the above described method of Example 9, manufacturing of an electrically conductive mayenite compound with a high electron density was tried. However, in the step of (Manufacturing electrically conductive mayenite compound), the heat process temperature was 1050° C.

With this, after the above described step of (Manufacturing electrically conductive mayenite compound), a black material E 52 whose surface was whitish was obtained.

Further, as a result of the X-ray diffraction analysis of a powder obtained by grinding the black material E 52 similar to the above described method of Example 1, it was revealed that the black material E 52 only included the C12A7 structure. However, the electron density of the black material E 52 was $2.1 \times 10^{19}$ cm$^{-3}$.

With this, it was confirmed that the black material E52 was not the electrically conductive mayenite compound with a high electron density.

Example 53

Similar to the above described method of Example 1, manufacturing of an electrically conductive mayenite compound with a high electron density was tried. However, the heat treatment of the body to be processed was performed under an environment where CO gas did not exist.

More specifically, for the apparatus 300 used in the step of (Manufacturing electrically conductive mayenite compound) of Example 1, the first carbon container 330, the second carbon container 350 and the carbon covers 335 and 355 were all exchanged by those made of alumina. Further, the pressure at a vacuum atmosphere at the heat treatment was 50 Pa.

With this, after the above described step of (Manufacturing electrically conductive mayenite compound), a black material E 53 whose surface was grey was obtained.

Further, as a result of the X-ray diffraction analysis of a powder obtained by grinding the black material E 53 similar to the above described method of Example 1, it was revealed that the black material E 53 did not have a single phase of the C12A7 structure.

With this, it was confirmed that the black material E53 was not a high purity electrically conductive mayenite compound.

Example 54

Similar to the above described method of Example 1, manufacturing of an electrically conductive mayenite compound with a high electron density was tried. However, the heat treatment of the sintered body D 1, that was the body to be processed, was performed under an environment where the metal aluminum layer 320 did not exist.

Further, when performing the heat treatment on the sintered body D 1, the furnace was evacuated to 100 Pa, and then, nitrogen gas, in which the oxygen concentration was less than or equal to 1 ppm, was introduced to the furnace to become atmospheric pressure.

With this, after the above described step of (Manufacturing electrically conductive mayenite compound), a black material E 54 whose surface was dingy was obtained.

Further, as a result of the X-ray diffraction analysis of a powder obtained by grinding the black material E 54 similar to the above described method of Example 1, it was revealed that the black material E 54 only included the C12A7 structure. However, the electron density of the black material E 54 was $4.8 \times 10^{19}$ cm$^{-3}$.

With this, it was confirmed that the black material E54 was not the electrically conductive mayenite compound with a high electron density.

Example 55

Similar to the above described method of Example 1, manufacturing of an electrically conductive mayenite compound with a high electron density was tried. However, the alumina block 325 and the alumina plate 328 were not used in the apparatus 300 that was used in the step of (Manufacturing electrically conductive mayenite compound), and the sintered body of the mayenite compound D1 was directly provided on the aluminum layer 320.

With this, after the above described step of (Manufacturing electrically conductive mayenite compound), a black material E 55 was obtained. However, the black material E 55 was half sunk in the aluminum layer 320, and much effort was necessary to collect the sample. Thus, it is considered that this method is not adaptable to industrial manufacturing.

Specifications, heat process conditions, evaluated results and the like of the body to be processed of Examples 1 to 16 and Examples 51 to 55 are illustrated in the following Table 1.

TABLE 1

| EXAMPLE | BODY TO BE PROCESSED | F ADDITION AMOUNT (x VALUE) | HEAT TREATMENT TEMPERATURE (° C.) | HEAT TREATMENT PERIOD (h) | PRESSURE AT VACUUM ATMOSPHERE (Pa) | RELATIVE DENSITY (%) | ELECTRON DENSITY (cm$^{-3}$) |
|---|---|---|---|---|---|---|---|
| EXAMPLE 1 | (ii) | — | 1300 | 6 | 20 | 97.9 | $1.6 \times 10^{21}$ |
| EXAMPLE 2 | (ii) | — | 1250 | 6 | 20 | 97.5 | $1.6 \times 10^{21}$ |
| EXAMPLE 3 | (ii) | — | 1300 | 2 | 20 | 96.1 | $1.1 \times 10^{21}$ |
| EXAMPLE 4 | (ii) | — | 1300 | 12 | 20 | 96.6 | $1.5 \times 10^{21}$ |
| EXAMPLE 5 | (ii) | — | 1380 | 6 | 20 | 98.0 | $1.3 \times 10^{21}$ |
| EXAMPLE 6 | (ii) | — | 1300 | 6 | 20 | 97.5 | $1.6 \times 10^{21}$ |
| EXAMPLE 7 | (ii) | — | 1300 | 6 | 50 | 97.6 | $1.4 \times 10^{21}$ |
| EXAMPLE 8 | (ii) | — | 1300 | 6 | 20 | 97.2 | $1.6 \times 10^{21}$ |
| EXAMPLE 9 | (i) | 0.32 | 1300 | 6 | 20 | 97.0 | $1.2 \times 10^{21}$ |
| EXAMPLE 10 | (i) | 0.32 | 1100 | 6 | 20 | 92.1 | $1.1 \times 10^{21}$ |
| EXAMPLE 11 | (i) | 0.32 | 1380 | 6 | 20 | 98.0 | $1.0 \times 10^{21}$ |
| EXAMPLE 12 | (i) | 0.48 | 1420 | 6 | 20 | 94.7 | $8.0 \times 10^{20}$ |
| EXAMPLE 13 | (i) | 0.06 | 1300 | 6 | 20 | 97.0 | $9.5 \times 10^{20}$ |
| EXAMPLE 14 | (i) | 0.32 | 1300 | 6 | 20 | 96.4 | $1.1 \times 10^{21}$ |
| EXAMPLE 15 | (ii) | 0.32 | 1300 | 6 | 20 | 97.3 | $1.0 \times 10^{21}$ |
| EXAMPLE 16 | (ii) | 0.32 | 1300 | 6 | 20 | 97.2 | $9.7 \times 10^{20}$ |
| EXAMPLE 51 | (i) | 0.32 | 1460 | 6 | 20 | — | $4.4 \times 10^{19}$ |

TABLE 1-continued

| EXAMPLE | BODY TO BE PROCESSED | F ADDITION AMOUNT (x VALUE) | HEAT TREATMENT TEMPERATURE (° C.) | HEAT TREATMENT PERIOD (h) | PRESSURE AT VACUUM ATMOSPHERE (Pa) | RELATIVE DENSITY (%) | ELECTRON DENSITY ($cm^{-3}$) |
|---|---|---|---|---|---|---|---|
| EXAMPLE 52 | (i) | 0.32 | 1050 | 6 | 20 | — | $2.1 \times 10^{19}$ |
| EXAMPLE 53 | (ii) | — | 1300 | 6 | 50 | — | — |
| EXAMPLE 54 | (ii) | — | 1300 | 6 | $1 \times 10^5$ (NITROGEN) | — | $4.8 \times 10^{19}$ |
| EXAMPLE 55 | (ii) | — | 1250 | 6 | 20 | 91.4 | $1.4 \times 10^{21}$ |

In Table 1, marks (i) and (ii) in the item "body to be processed" indicate that the body to be processed is a compact body of the mayenite compound and the body to be processed is a sintered body of the mayenite compound, respectively.

Further, a value in the item "F addition amount (x value)" indicates the fluorine (F) amount included in the respective body to be processed. This value indicates a value of "x" when it is assumed that the mayenite compound expressed by the following equation (4) is finally manufactured from the body to be processed.

$$(12-x)CaO \cdot 7Al_2O_3 \cdot xCaF_2 \qquad (4)$$

The present embodiment is adaptable for a method of manufacturing an electrically conductive mayenite compound with a high electron density that can be used for a sputtering target or the like necessary for forming a thin film of an electron injection layer of an organic EL element.

Although a preferred embodiment of the method of manufacturing an electrically conductive mayenite compound with a high electron density has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

What is claimed is:

1. A method of manufacturing an electrically conductive mayenite compound, comprising:
   (1) preparing a body to be processed including a mayenite compound; and
   (2) placing the body to be processed in the presence of carbon monoxide gas and aluminum vapor supplied from an aluminum source without being in contact with the aluminum source and retaining the body to be processed at a temperature range of 1080° C. to 1450° C. under a reducing atmosphere.

2. The method of manufacturing an electrically conductive mayenite compound according to claim 1, wherein the body to be processed includes a fluorine (F) component.

3. The method of manufacturing an electrically conductive mayenite compound according to claim 2, wherein step (2) is performed under a status that the body to be processed and the aluminum source are input in a container including carbon.

4. The method of manufacturing an electrically conductive mayenite compound according to claim 2, wherein the body to be processed including the mayenite compound is a compact body including a mayenite compound powder including a fluorine (F) component, or a sintered body including a mayenite compound including a fluorine (F) component.

5. The method of manufacturing an electrically conductive mayenite compound according to claim 2, wherein a mayenite compound in which fluorine ions are introduced is manufactured after step (2).

6. The method of manufacturing an electrically conductive mayenite compound according to claim 2, wherein step (2) is performed at a vacuum atmosphere whose pressure is less than or equal to 100 Pa, or at an inert-gas atmosphere except nitrogen.

7. The method of manufacturing an electrically conductive mayenite compound according to claim 2, wherein said placing the body to be processed produces an electrically conductive mayenite compound whose electron density is greater than or equal to $3 \times 10^{20}$ $cm^{-3}$.

8. The method of manufacturing an electrically conductive mayenite compound according to claim 1, wherein the body to be processed including the mayenite compound is a sintered body including a mayenite compound.

9. The method of manufacturing an electrically conductive mayenite compound according to claim 1, wherein said placing the body to be processed in the presence of carbon monoxide gas and aluminum vapor supplied from an aluminum source further comprises providing a material between the aluminum source and the body to be processed so that the body to be processed is not in contact with the aluminum source, wherein the material does not react with aluminum vapor and the body to be processed.

10. A method of manufacturing a target for depositing a film comprising: manufacturing the target for depositing the film to include the electrically conductive mayenite compound by the method of claim 1.

* * * * *